(12) United States Patent
Gao et al.

(10) Patent No.: US 11,538,504 B2
(45) Date of Patent: Dec. 27, 2022

(54) SUPPORTING DEVICE AND RELATED ELECTRONIC APPARATUS

(71) Applicant: Wiwynn Corporation, New Taipei (TW)

(72) Inventors: Jing-Suei Gao, New Taipei (TW); Ming-Chih Kao, New Taipei (TW)

(73) Assignee: Wiwynn Corporation, New Taipei (TW)

( * ) Notice: Subject to any disclaimer, the term of this patent is extended or adjusted under 35 U.S.C. 154(b) by 0 days.

(21) Appl. No.: 17/356,448

(22) Filed: Jun. 23, 2021

(65) Prior Publication Data

US 2022/0342464 A1  Oct. 27, 2022

(30) Foreign Application Priority Data

Apr. 21, 2021 (TW) ................................. 110114363

(51) Int. Cl.
| | | |
|---|---|---|
| *G11B 33/12* | (2006.01) | |
| *G06F 1/18* | (2006.01) | |
| *H05K 7/14* | (2006.01) | |

(52) U.S. Cl.
CPC ............ *G11B 33/124* (2013.01); *G06F 1/187* (2013.01); *H05K 7/1489* (2013.01)

(58) Field of Classification Search
None
See application file for complete search history.

(56) References Cited

U.S. PATENT DOCUMENTS

| | | | |
|---|---|---|---|
| 2013/0162131 A1* | 6/2013 | Zhou | ....................... G06F 1/187 312/304 |
| 2014/0339975 A1 | 11/2014 | Fan et al. | |
| 2019/0090376 A1 | 3/2019 | Kho et al. | |

FOREIGN PATENT DOCUMENTS

TW         M589414 U      1/2020

* cited by examiner

*Primary Examiner* — Craig A. Renner
(74) *Attorney, Agent, or Firm* — Winston Hsu

(57) ABSTRACT

A supporting device is assembled with an accommodating device of an electronic apparatus. The supporting device includes a casing and an engaging module. The engaging module is slidably disposed on the casing to engage with the accommodating device. The engaging module includes an engaging component, a pressing component and a fixing component. The engaging component includes an engaging portion and a sliding slot. The engaging portion is engaged with the accommodating device. The pressing component is disposed on the engaging component in a resiliently deformable manner. The fixing component pierces through the sliding slot to fix the engaging component on the casing.

12 Claims, 9 Drawing Sheets

SUPPORTING DEVICE AND RELATED ELECTRONIC APPARATUS

BACKGROUND OF THE INVENTION

1. Field of the Invention

The present disclosure relates to a supporting device and an electronic apparatus, and more particularly, to a supporting device capable of bearing violent collision and a related electronic apparatus.

2. Description of the Prior Art

A conventional server disposes a plurality of hard disks inside casings, and the casings are disposed inside a rack via sliders. Each of a left side and a right side of the casing has an engagement mechanism used to constrain a movement of the casing relative to the rack. A resilient piece of the engagement mechanism is fixed on a lateral wall of the casing via rivet or other fixing component. The resilient piece has a protruding portion, and the protruding portion passes through the lateral wall of the casing to insert into a corresponding hole on the rack, for constraining the foresaid movement. However, if the server is hit, the casing may be violently collided with the rack, and the protruding portion of the resilient piece directly hit the hole on the rack; meanwhile, the rivet is affected by collision and easily damaged, and the engagement mechanism cannot constrain the movement of the casing due to the damaged rivet. Thus, design of a casing and a related server capable of keeping preferred constraint function when being hit by violent collision is an important issue in the mechanical design industry.

SUMMARY OF THE INVENTION

The present disclosure provides a supporting device capable of bearing violent collision and a related electronic apparatus for solving above drawbacks.

According to the claimed disclosure, a supporting device assembled with an accommodating device and includes a casing and an engaging module. The engaging module is slidably disposed on the casing to engage with the accommodating device. The engaging module includes an engaging component, a pressing component and a fixing component. The engaging component has an engaging portion and a sliding slot, and the engaging portion is engaged with the accommodating device. The pressing component is disposed on the engaging component in a resiliently deformable manner. The fixing component pierces through the sliding slot to fix the engaging component on the casing.

According to the claimed disclosure, the casing has a hole, and the engaging portion passes through the hole to engage with the accommodating device.

According to the claimed disclosure, a structural direction of the sliding slot is parallel to a moving direction of the casing relative to the accommodating device, and the engaging module is moved relative to the casing along the moving direction.

According to the claimed disclosure, an opening slot is formed on an end of the pressing component, the other end of the pressing component is fixed to the engaging component, the fixing component passes through the sliding slot and the opening slot to assemble the engaging module with the casing, and the pressing component is disposed on the engaging component in the resiliently deformable manner.

According to the claimed disclosure, a structural direction of the opening slot is parallel to a moving direction of the casing relative to the accommodating device.

According to the claimed disclosure, the pressing component includes a first area and a second area connected to each other, the first area is disposed on the casing, and the second area movably contacts against the engaging component.

According to the claimed disclosure, the pressing component includes a first area, a second area and a third area connected to each other, the first area and the third area are respectively disposed on two opposite sides of the second area, the first area and the third area are disposed on the casing, the second area movably contacts against the engaging component.

According to the claimed disclosure, at least one of a concave structure and a hollow structure is disposed on a central region of the engaging component.

According to the claimed disclosure, an electronic apparatus includes an accommodating device and a supporting device. The supporting device is assembled with the accommodating device in a separable manner. The supporting device includes a casing and an engaging module. The engaging module is disposed on the casing to engage with the accommodating device. The engaging module includes an engaging component, a pressing component and a fixing component. The engaging component has an engaging portion and a sliding slot, and the engaging portion is engaged with the accommodating device. The pressing component is disposed on the engaging component in a resiliently deformable manner. The fixing component pierces through the sliding slot to fix the engaging module on the casing.

The supporting device of the present disclosure can pass the fixing component through the sliding slot to suspend the engaging component above the casing. The interval between the engaging portion of the engaging component and the hole on the casing can be smaller than the interval between the fixing component and the sliding slot of the engaging component. When the supporting device is hit, the external collision is sustained by the engaging portion, and the fixing component does not contact the inner surface of the sliding slot on the engaging component, so that the fixing component cannot be deformed or damaged. Further, the supporting device can dispose the pressing component on the engaging component; the fixing component can pass through the opening slot on the pressing component to suspend the pressing component above the casing. The pressing component can apply the resilient recovering force for enhancing the resilient recovering force of the engaging component, so as to ensure the engaging portion can be set in an initial state of inserting into the hole on the casing and being engaged with the accommodating device. Comparing to the prior art, the supporting device and the electronic apparatus of the present disclosure can have advantages of simple structure and easy assembly. The supporting device can provide functions of stable engagement and convenient disassembly without complicated structures, and can be rapidly repaired to reduce manufacturing and maintaining cost.

These and other objectives of the present invention will no doubt become obvious to those of ordinary skill in the art after reading the following detailed description of the preferred embodiment that is illustrated in the various figures and drawings.

DETAILED DESCRIPTION

Figure 1:
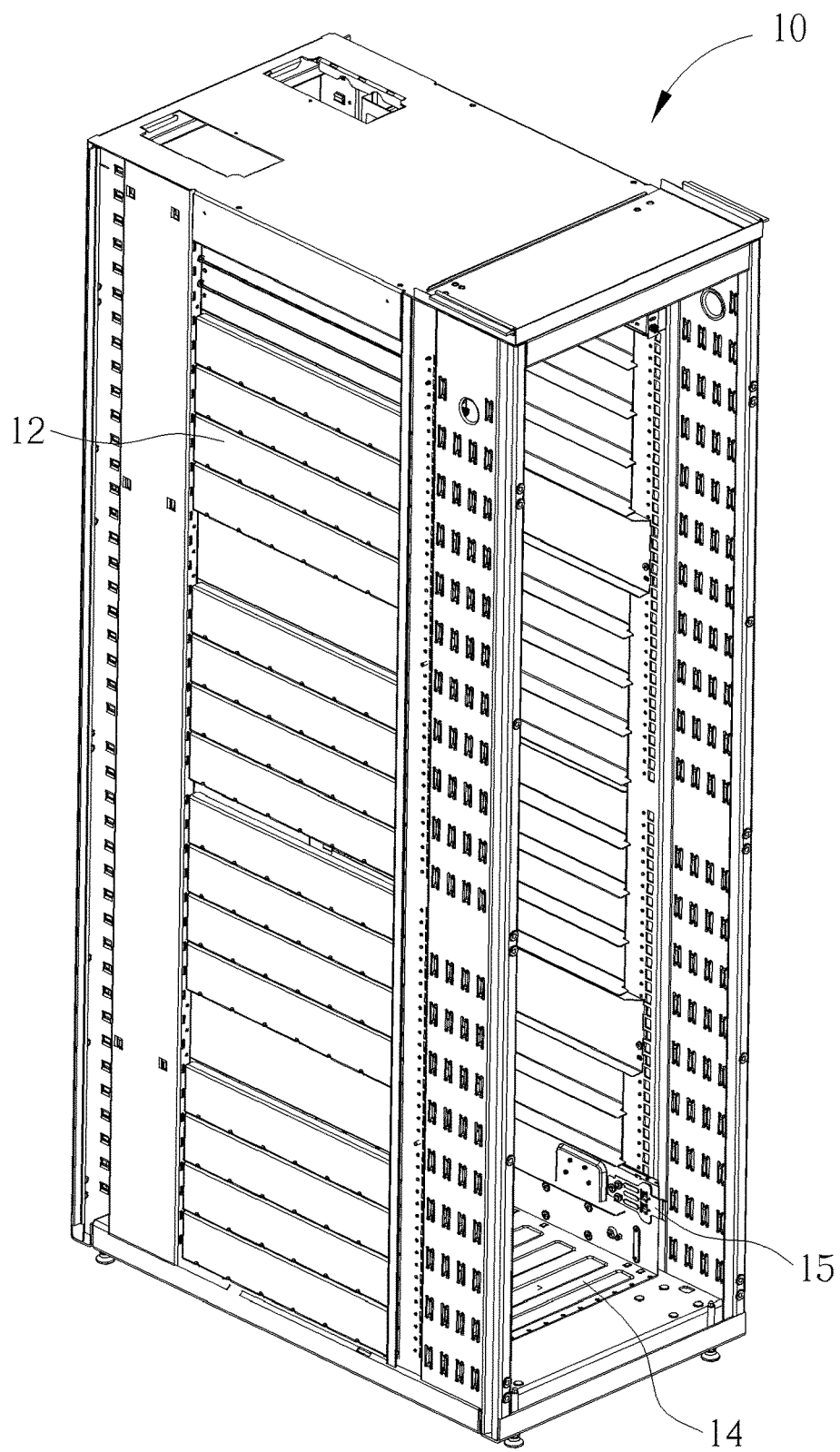
FIG. 1 is an assembly diagram of an electronic apparatus according to an embodiment of the present disclosure.
Figure 2:
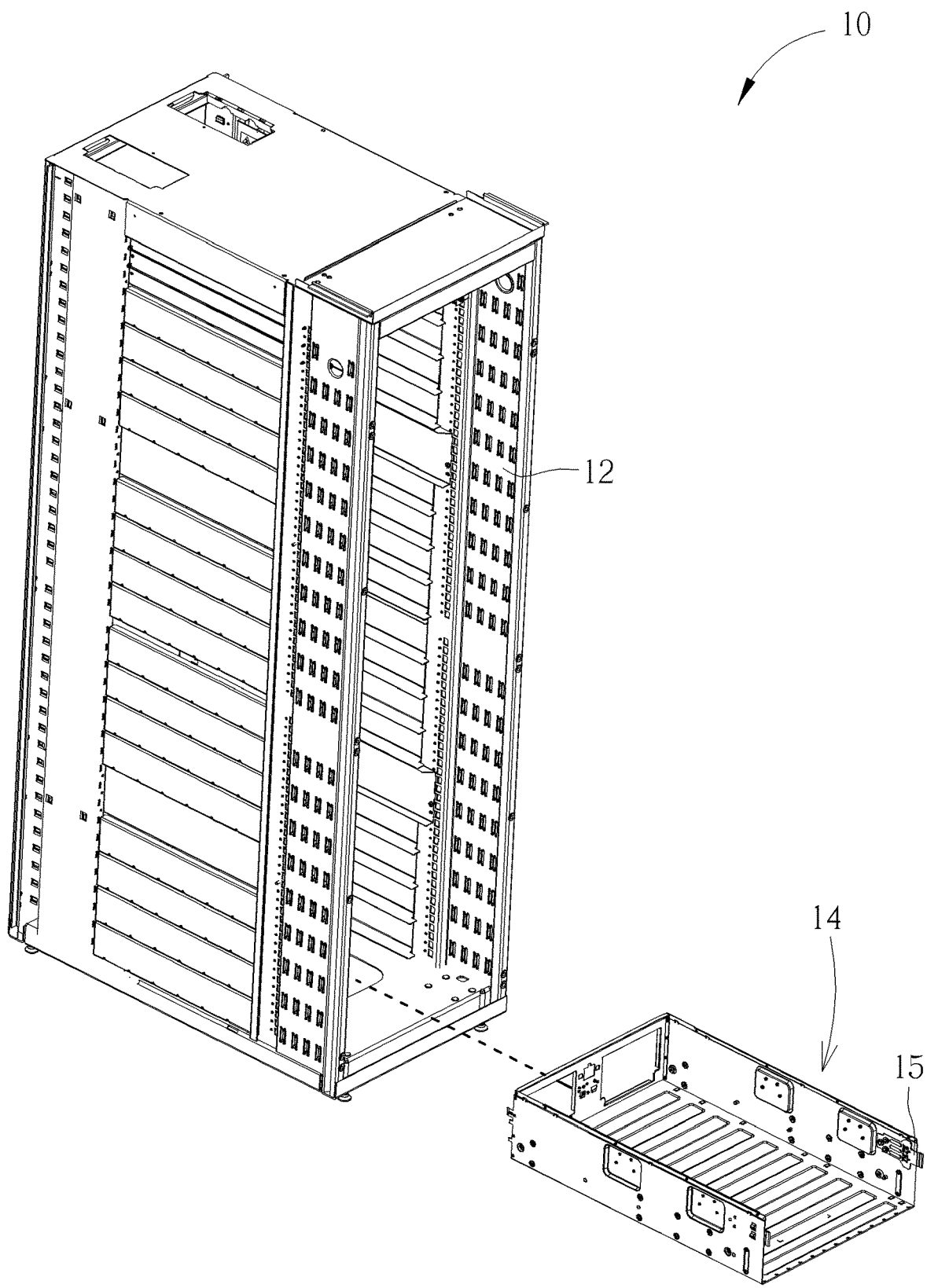
FIG. 2 is an exploded diagram of the electronic apparatus according to the embodiment of the present disclosure.

Please refer to FIG. 1 and FIG. 2. FIG. 1 is an assembly diagram of an electronic apparatus 10 according to an embodiment of the present disclosure. FIG. 2 is an exploded diagram of the electronic apparatus 10 according to the embodiment of the present disclosure. The electronic apparatus 10 can include an accommodating device 12 and a supporting device 14. The supporting device 14 can be assembled with the accommodating device 12 in a separable manner. The electronic apparatus 10 can be a cloud server, or other apparatus with a demand for assembling and disassembling an element. The accommodating device 12 can be a rack of the electronic apparatus 10, and a slider or other mechanism (which is not shown in the figures) with the same or similar functions can be disposed inside the rack. The supporting device 14 can be assembled with and disassembled from the accommodating device 12 through the slider in a separable manner. The supporting device 14 can be fixed onto the accommodating device 12 via an engaging module 15. An electronic component, such as a hard disk, can be disposed inside the supporting device 14. The supporting device 14 can be conveniently and easily removed from the accommodating device 12 for repairing or replacing the electronic component disposed inside the supporting device 14.

Figure 3:
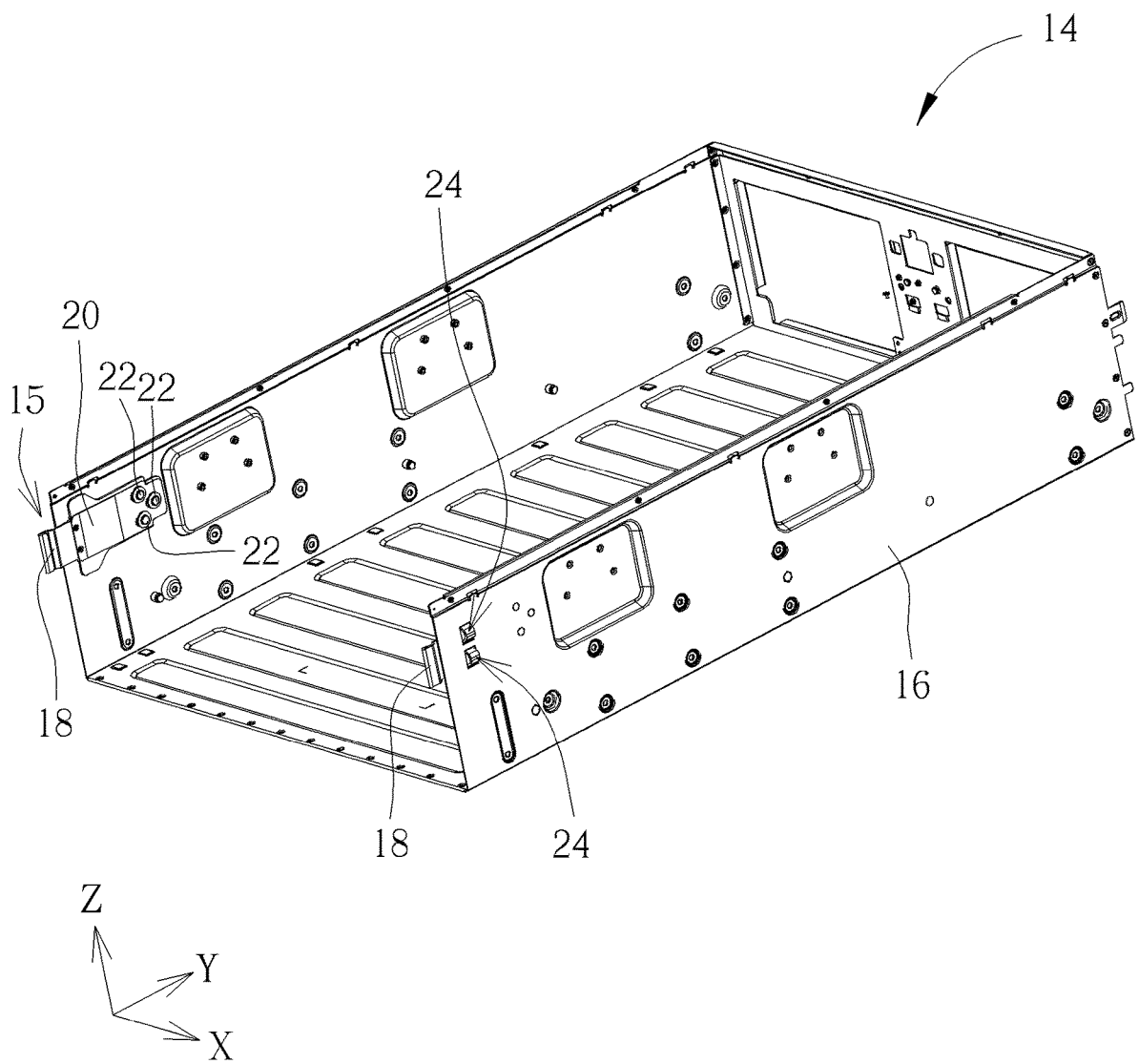
FIG. 3 is a diagram of a supporting device according to the embodiment of the present disclosure.
Figure 4:
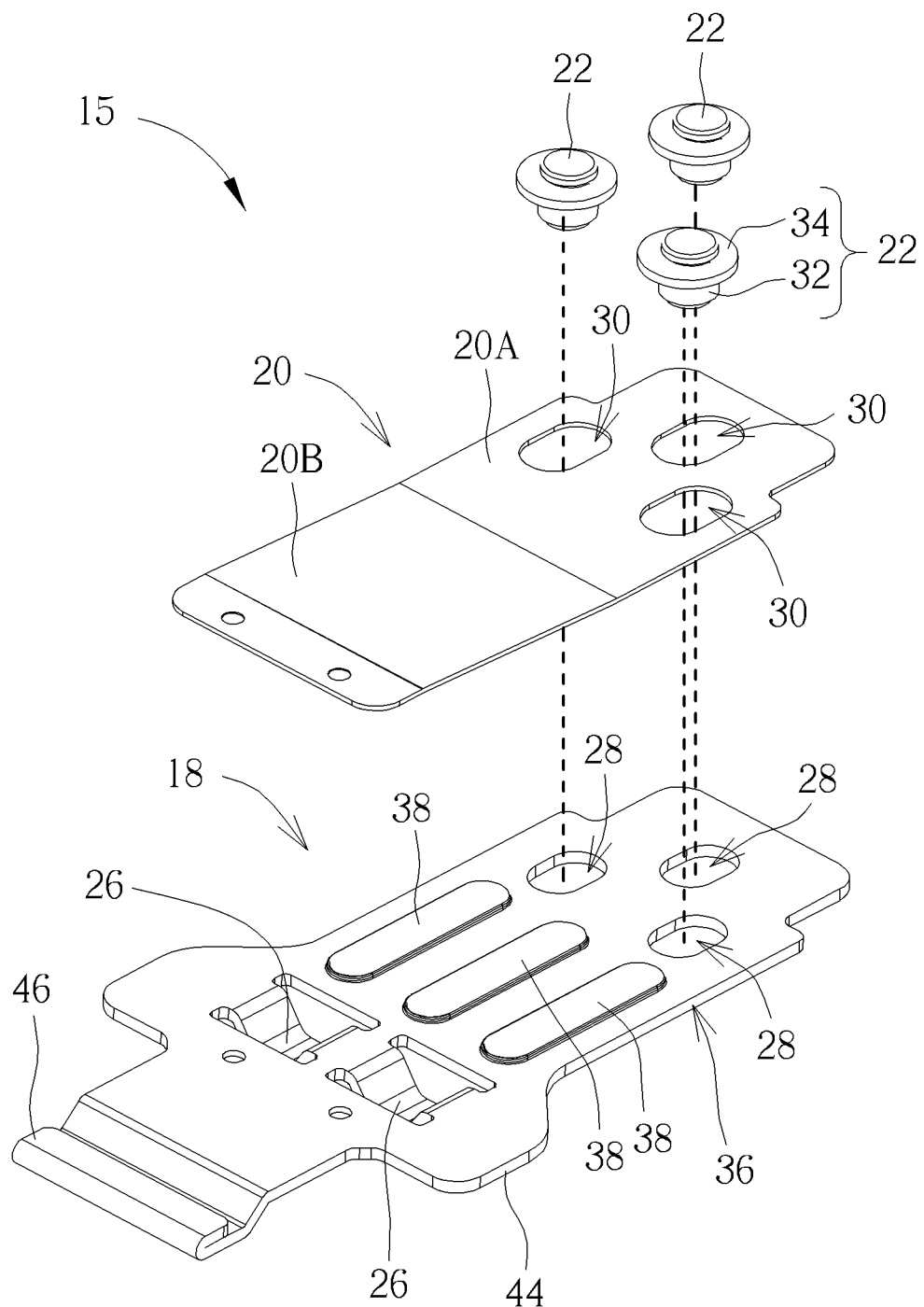
FIG. 4 and FIG. 5 are exploded diagrams of an engaging module in different views according to the embodiment of the present disclosure.
Figure 5:
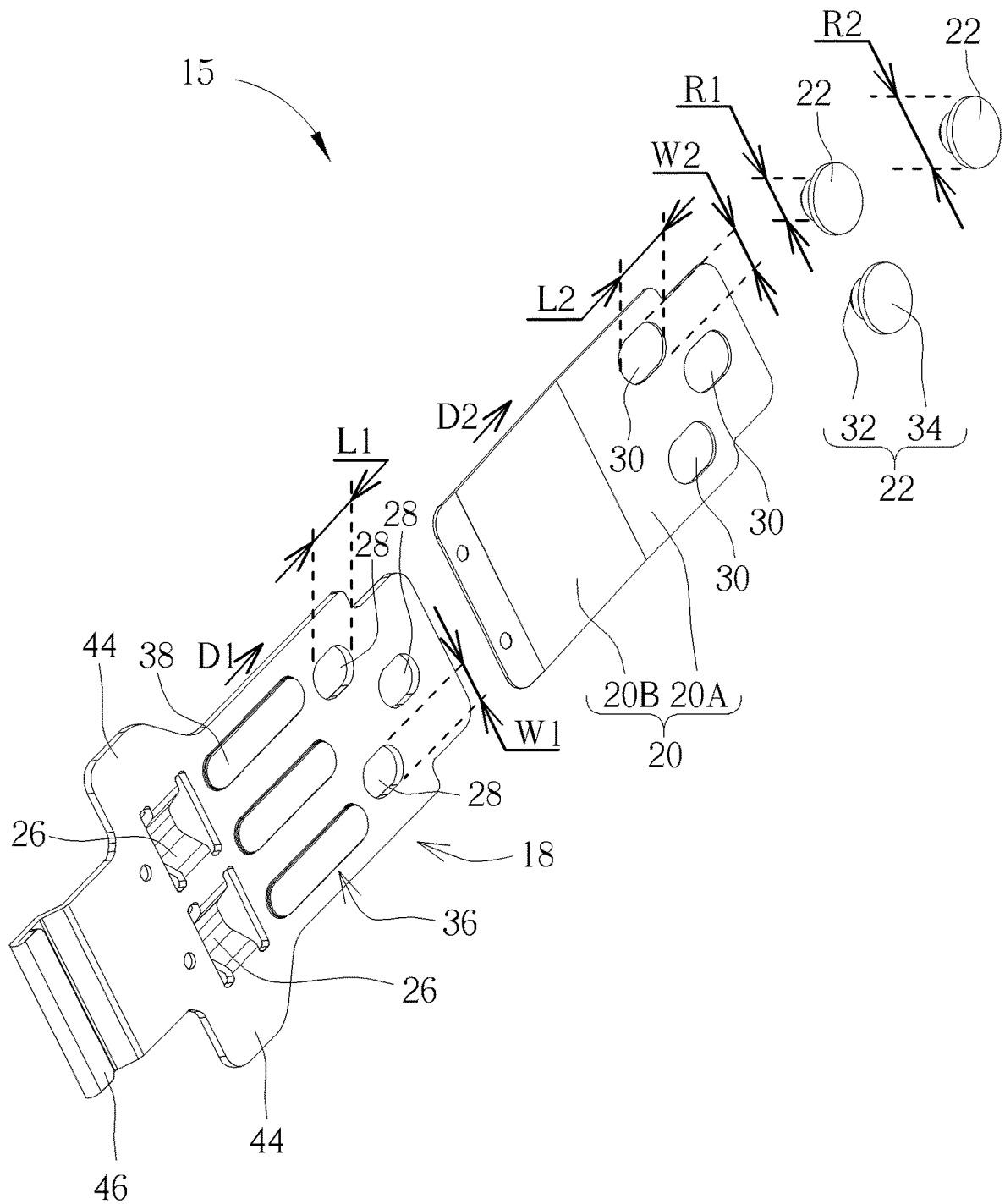
Figure 6:
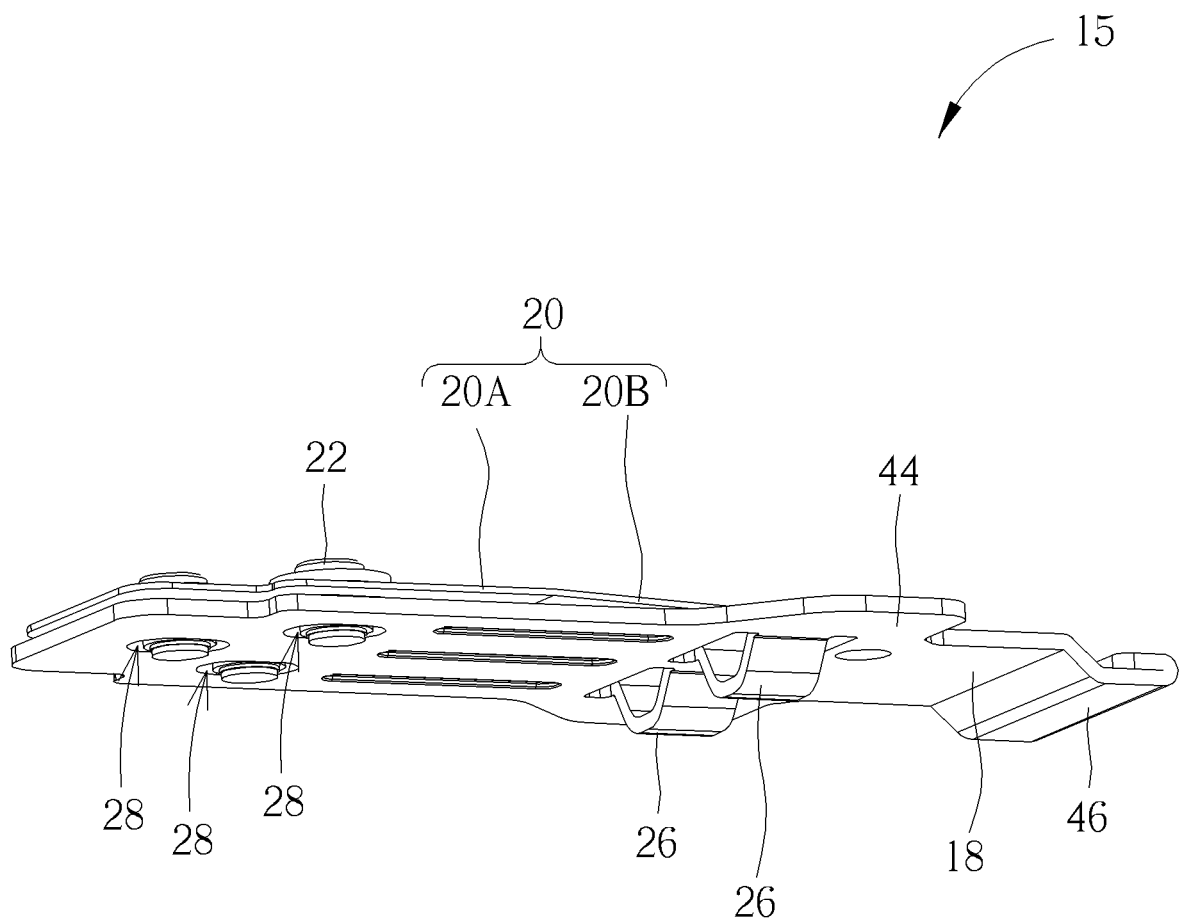
FIG. 6 is an assembly diagram of the engaging module according to the embodiment of the present disclosure.
Figure 7:
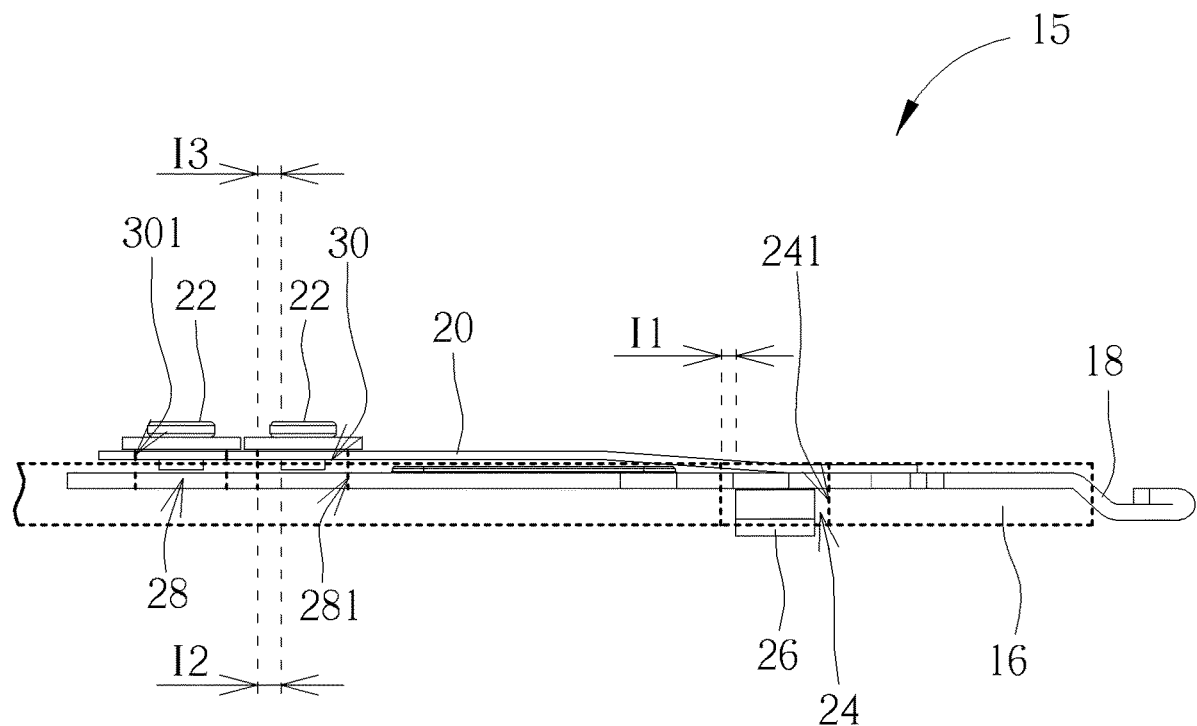
FIG. 7 is a lateral view of the supporting device according to the embodiment of the present disclosure.

Please refer to FIG. 3 to FIG. 7. FIG. 3 is a diagram of the supporting device 14 according to the embodiment of the present disclosure. FIG. 4 and FIG. 5 are exploded diagrams of the engaging module 15 in different views according to the embodiment of the present disclosure. FIG. 6 is an assembly diagram of the engaging module 15 according to the embodiment of the present disclosure. FIG. 7 is a lateral view of the supporting device 14 according to the embodiment of the present disclosure. The supporting device 14 can include the engaging module 15 and a casing 16. The engaging module 15 can be slidably disposed on the casing 16 to assemble with the accommodating device 12. The engaging module 15 can include an engaging component 18, a pressing component 20 and a fixing component 22. The fixing component 22 can pierce through the engaging component 18 and the pressing component 20 to fix on the casing 16. The casing 16 can be interpreted as a lateral wall of the supporting device 14, and further can be a carrier of holding the engaging module 15. The casing 16 can have a hole 24 formed on a wall of the carrier and located adjacent to the engaging component 18.

The engaging module 15 can include one or several fixing components 22, and a number of the fixing component 22 depends on a design demand. The engaging component 18 can have an engaging portion 26 and a sliding slot 28. A number of the sliding slot 28 can correspond to the number of the fixing component 22. The engaging portion 26 can pass through the hole 24 to engage with a corresponding dent formed on the accommodating device 12. The fixing component 22 can be a screw, a bolt or a rivet passing through the sliding slot 28 to fix on the casing 16, so that the engaging component 18 can be disposed on the casing 16 and slid relative to the fixing component 22.

Besides, the engaging component 18 can optionally include a strengthening portion 44 and a holding portion 46. The strengthening portion 44 can be disposed adjacent to the engaging portion 26, and used to increase structural intensity of the engaging component 18 for compensating an effect upon the engaging portion 26. The sliding slot 28 can be disposed on a fixing end of the engaging component 18, and the holding portion 46 can be disposed on a free end of the engaging component 18 opposite to the sliding slot 28. The holding portion 46 can be manually pressed to bend the engaging component 18, and the engaging portion 26 can be separated from the hole 24 and the accommodating device 12 along the X-axis, so that the supporting device 14 can be removed from the accommodating device 12. If an external force applied to the holding portion 46 is removed, a resilient recovering force of the engaging component 18 and a resilient recovering force of the pressing component 20 can drive the engaging portion 26 to automatically insert into the hole 24 for engaging with the corresponding dent on the accommodating device 12.

The pressing component 20 can contact against the engaging component 18 in a resiliently deformable manner, and provide a force of supporting the engaging component 18 along the X-axis. In the embodiment, an opening slot 30 can be formed on an end of the pressing component 20, and the other end of the pressing component 20 can be fixed on the engaging component 18. A number of the opening slot 30 can correspond to the number of the fixing component 22. The fixing component 22 can pass through the opening slot 30 to fix onto the casing 16, and the pressing component 20 can be disposed on the casing 16 and slid relative to the fixing component 22.

The fixing component 22 can include an axle portion 32 and an abutting portion 34 connected to each other. A structural direction D1 of the sliding slot 28 and a structural direction D2 of the opening slot 30 can be parallel to a moving direction of the supporting device 14 relative to the accommodating device 12; the moving direction can point toward the Y-axis. A slot length L1 of the sliding slot 28 and a slot length L2 of the opening slot 30 can be greater than a radial dimension R1 of the axle portion 32. The engaging module 15 can be moved relative to the casing 16 via a gap between the sliding slot 28 and the fixing component 22. The pressing component 20 can be moved relative to the casing 16 via a gap between the opening slot 30 and the fixing component 22. A slot width W1 of the sliding slot 28 and a slot width W2 of the opening slot 30 can be smaller than a radial dimension R2 of the abutting portion 34, so as to prevent the engaging component 18 and the pressing component 20 from being separated from the fixing component 22.

Besides, the pressing component 20 can include a first area 20A and a second area 20B connected to each other. The opening slot 30 can be disposed on the first area 20A, and the first area 20A can be disposed on the casing 16 via assembly of the fixing component 22 and the opening slot 30. The second area 20B can be slightly bent relative to the first area 20A, and contact against the engaging component 18 in a movable and separable manner. In the present disclosure, the engaging component 18 has a predefined structural thickness and the engaging portion 26 is sufficient to sustain an external collision; the resilient recovering force of the engaging component 18 may be decreased because of the foresaid structural thickness, so the supporting device 14 can further assemble the pressing component 20 with the engaging component 18, and the pressing component 20 can provide the resilient recovering force for ensuring that the engaging portion 26 of the engaging component 18 can stably pass through the hole 24 on the casing 16 and be engaged with the accommodating device 12.

As shown in FIG. 7, when the engaging component 18 and the pressing component 20 are disposed on the casing 16 via the fixing component 22, and the supporting device 14 is motionless and not moved relative to the accommodating device 12, a first interval I1 between the engaging portion 26 and an inner surface 241 of the hole 24 can be smaller than a second interval I2 between the fixing component 22 and an inner surface 281 of the sliding slot 28; in addition, the first interval I1 can be smaller than a third interval I3 between the fixing component 22 and an inner surface 301 of the opening slot 30. The second interval I2 may be the same as or different from the third interval I3, which depends on the design demand of the sliding slot 28 and the opening slot 30. Thus, if the supporting device 14 is moved relative to the accommodating device 12 due to the external collision, the engaging portion 26 can contact the inner surface 241 of the hole 24, and the fixing component 22 does not contact the inner surface 281 of the sliding slot 28 or the inner surface 301 of the opening slot 30. The external collision can be sustained by the engaging portion 26 and not transmitted to the fixing component 22, so as to prevent the fixing component 22 from being damaged by the external collision.

Figure 8:
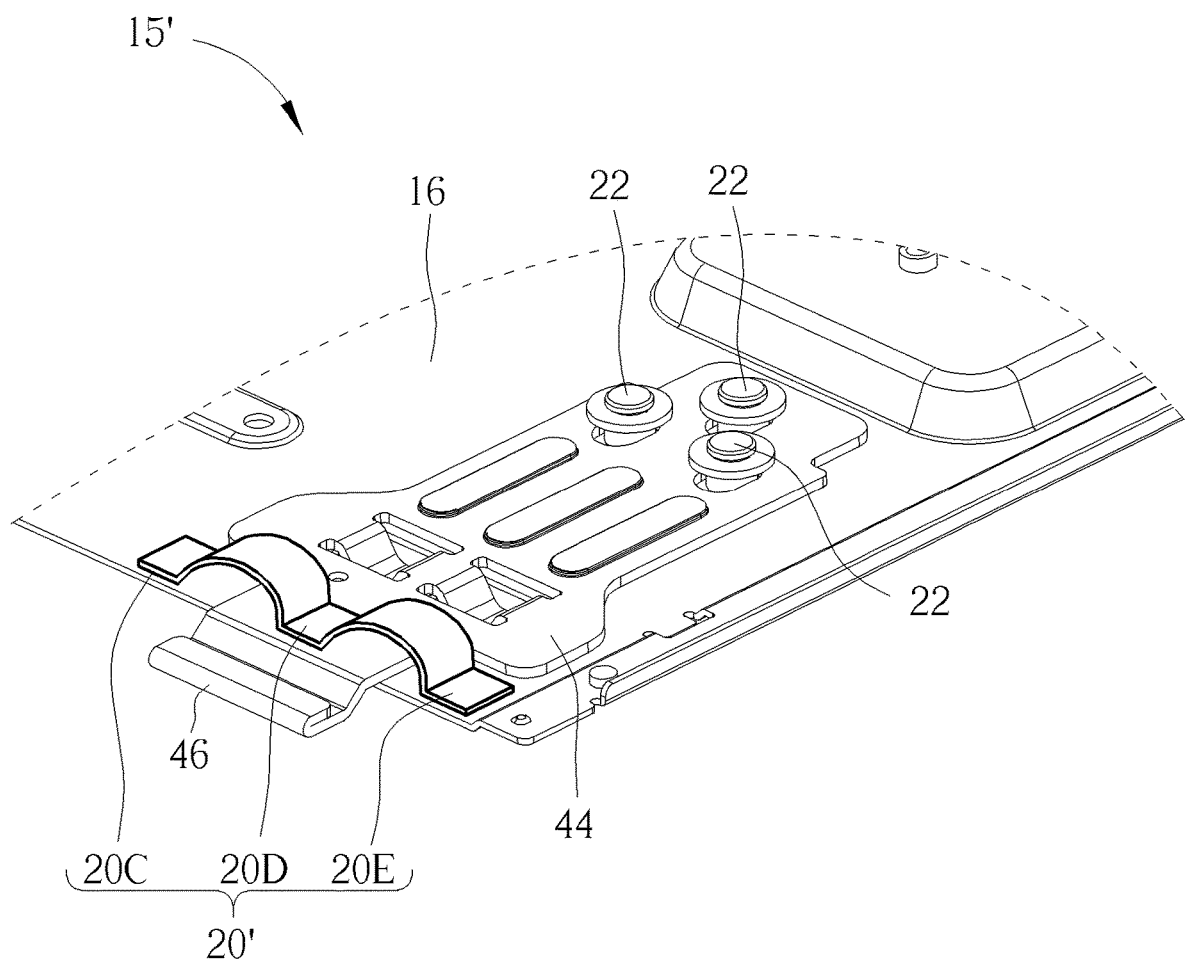
FIG. 8 is an assembly diagram of the engaging module according to another embodiment of the present disclosure.

Please refer to FIG. 8. FIG. 8 is an assembly diagram of the engaging module 15' according to another embodiment of the present disclosure. In the embodiment, elements having the same numerals as ones of the foresaid embodiment have the same structures and functions, and a detailed description is omitted herein for simplicity. The pressing component 20' of the engaging module 15' can include a first area 20C, a second area 20D and a third area 20E connected to each other. The first area 20C and the third area 20E can be respectively disposed on two opposite sides of the second area 20D. The first area 20C and the third area 20E can be disposed on the casing 16 via the screw, the bolt or the rivet. The second area 20D can contact against the engaging component 18 in a movable manner. In the embodiment, the second area 20D can be preferably bent and connected to the first area 20C and the third area 20E, so that the resilient recovering force of the pressing component 20' can press the engaging portion 26 of the engaging component 18 stably passing through the hole 24 on the casing 16. A type of the pressing component is not limited to the above-mentioned embodiments, and depends on the actual demand.

As shown in FIG. 5, the foresaid embodiment can dispose one or several ribs 38 on a central region 36 of the engaging component 18, so as to increase the structural intensity of the engaging component 18; however, the resilient recovering force of the engaging component 18 may be decreased due to the enlarged structural thickness via addition of the rib 38. The present disclosure can provide other possible embodiment to increase the resilient recovering force by improving the structural property of the engaging component 18.

Figure 9:
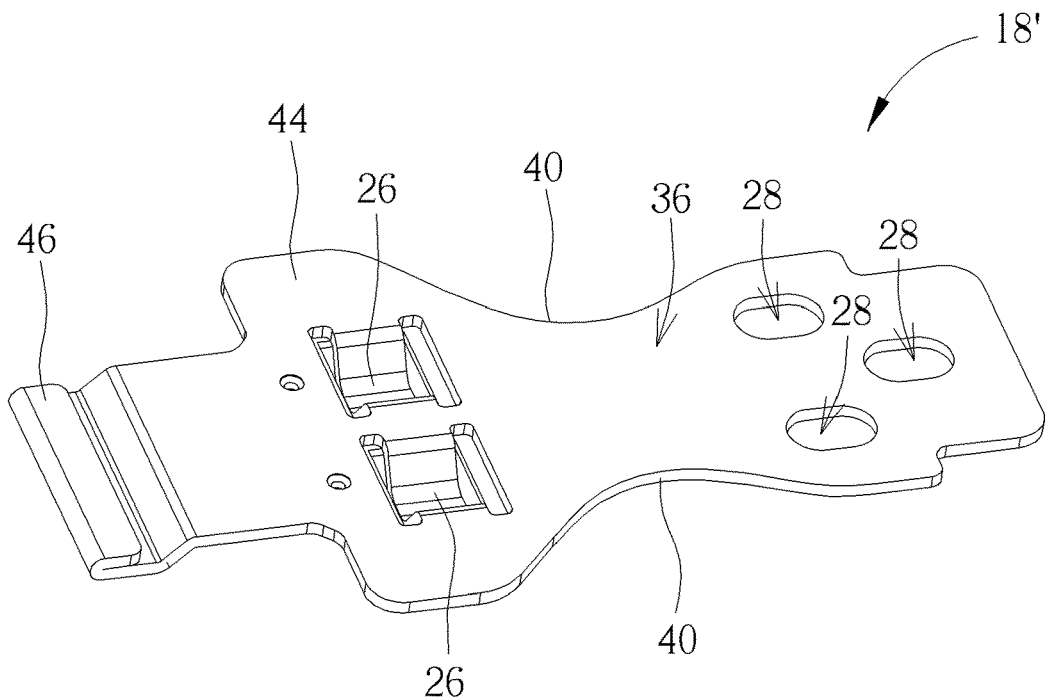
FIG. 9 and FIG. 10 are diagrams of an engaging component in other types according to the embodiment of the present disclosure.
Figure 10:
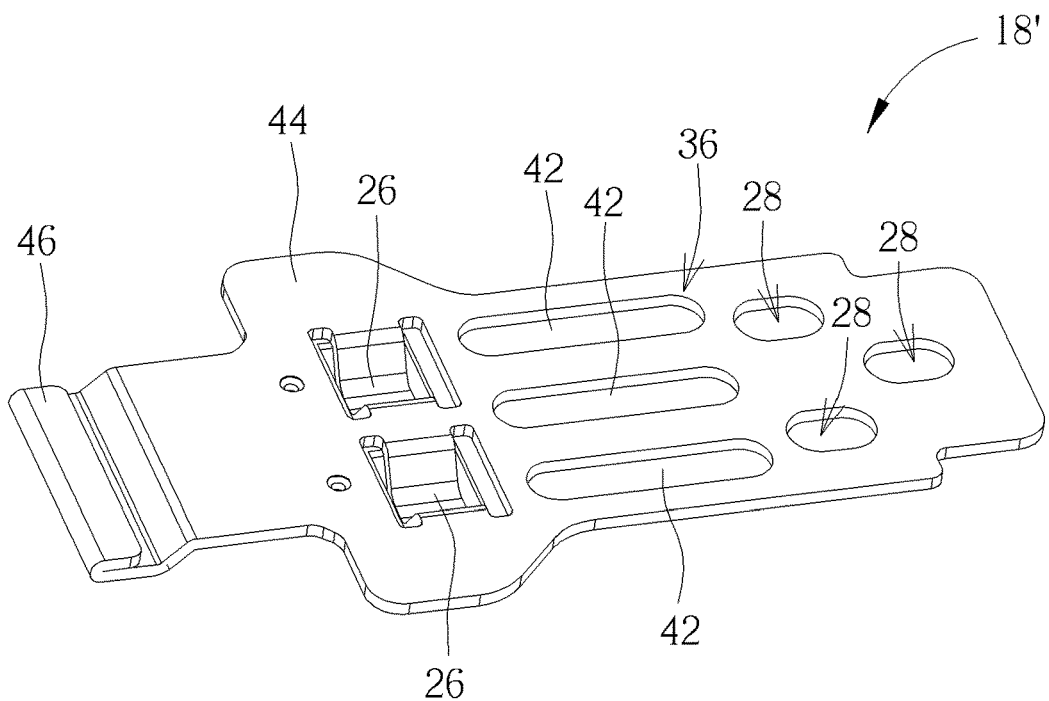

Please refer to FIG. 9 and FIG. 10. FIG. 9 and FIG. 10 are diagrams of the engaging component 18' in other types according to the embodiment of the present disclosure. In the embodiment, elements having the same numerals as ones of the foresaid embodiment have the same structures and functions, and the detailed description is omitted herein for simplicity. As shown in FIG. 9, the central region 36 of the engaging component 18' can have one or several concave structures 40; one side of the central region 36 can be caved in toward the other side of the central region 36 to form the concave structure 40. The engaging component 18' can utilize the engaging portion 26 to sustain the external collision, so that a structural thickness of the engaging component 18' which has the concave structure 40 can be decreased for increasing the resilient recovering force. As shown in FIG. 10, the central region 36 of the engaging component 18' can have one or several hollow structures 42; the structural thickness of the engaging component 18' can be decreased via setting of the hollow structure 42, and the resilient recovering force can be increased accordingly.

In conclusion, the supporting device of the present disclosure can pass the fixing component through the sliding slot to suspend the engaging component above the casing. The interval between the engaging portion of the engaging component and the hole on the casing can be smaller than the interval between the fixing component and the sliding slot of the engaging component. When the supporting device is hit, the external collision is sustained by the engaging portion, and the fixing component does not contact the inner surface of the sliding slot on the engaging component, so that the fixing component cannot be deformed or damaged. Further, the supporting device can dispose the pressing component on the engaging component; the fixing component can pass through the opening slot on the pressing component to suspend the pressing component above the casing. The pressing component can apply the resilient recovering force for enhancing the resilient recovering force of the engaging component, so as to ensure the engaging portion can be set in an initial state of inserting into the hole on the casing and being engaged with the accommodating device. Comparing to the prior art, the supporting device and the electronic apparatus of the present disclosure can have advantages of simple structure and easy assembly. The supporting device can provide functions of stable engagement and convenient disassembly without complicated structures, and can be rapidly repaired to reduce manufacturing and maintaining cost.

Those skilled in the art will readily observe that numerous modifications and alterations of the device and method may be made while retaining the teachings of the invention. Accordingly, the above disclosure should be construed as limited only by the metes and bounds of the appended claims.

What is claimed is:

1. A supporting device assembled with an accommodating device, the supporting device comprising:
   a casing; and
   an engaging module slidably disposed on the casing to engage with the accommodating device, the engaging module comprising:
      an engaging component having an engaging portion and a sliding slot, the engaging portion being engaged with the accommodating device;
      a pressing component disposed on the engaging component in a resiliently deformable manner; and
      a fixing component piercing through the sliding slot to fix the engaging component on the casing;

wherein an opening slot is formed on an end of the pressing component, the other end of the pressing component is fixed to the engaging component, the fixing component passes through the sliding slot and the opening slot to assemble the engaging module with the casing, and the pressing component is disposed on the engaging component in the resiliently deformable manner.

2. The supporting device of claim 1, wherein the casing has a hole, the engaging portion passes through the hole to engage with the accommodating device.

3. The supporting device of claim 1, wherein a structural direction of the sliding slot is parallel to a moving direction of the casing relative to the accommodating device, and the engaging module is moved relative to the casing along the moving direction.

4. The supporting device of claim 1, wherein a structural direction of the opening slot is parallel to a moving direction of the casing relative to the accommodating device.

5. The supporting device of claim 1, wherein the pressing component comprises a first area and a second area connected to each other, the first area is disposed on the casing, and the second area movably contacts against the engaging component.

6. The supporting device of claim 1, wherein at least one of a concave structure and a hollow structure is disposed on a central region of the engaging component.

7. An electronic apparatus, comprising:
an accommodating device; and
a supporting device assembled with the accommodating device in a separable manner, the supporting device comprising:
a casing; and
an engaging module disposed on the casing to engage with the accommodating device, the engaging module comprising:
an engaging component having an engaging portion and a sliding slot, the engaging portion being engaged with the accommodating device;
a pressing component disposed on the engaging component in a resiliently deformable manner; and
a fixing component piercing through the sliding slot to fix the engaging module on the casing;
wherein an opening slot is formed on an end of the pressing component, the other end of the pressing component is fixed to the engaging component, the fixing component passes through the sliding slot and the opening slot to assemble the engaging module with the casing, and the pressing component is disposed on the engaging component in the resiliently deformable manner.

8. The electronic apparatus of claim 7, wherein the casing has a hole, the engaging portion passes through the hole to engage the supporting device with the accommodating device.

9. The electronic apparatus of claim 7, wherein a structural direction of the sliding slot is parallel to a moving direction of the casing relative to the accommodating device, and the engaging module is moved relative to the casing along the moving direction.

10. The electronic apparatus of claim 7, wherein a structural direction of the opening slot is parallel to a moving direction of the casing relative to the accommodating device.

11. The electronic apparatus of claim 7, wherein the pressing component comprises a first area and a second area connected to each other, the first area is disposed on the casing, and the second area movably contacts against the engaging component.

12. The electronic apparatus of claim 7, wherein at least one of a concave structure and a hollow structure is disposed on a central region of the engaging component.

* * * * *